(12) United States Patent  
Chou et al.

(10) Patent No.: US 9,159,723 B2  
(45) Date of Patent: Oct. 13, 2015

(54) METHOD FOR MANUFACTURING SEMICONDUCTOR DEVICE AND SEMICONDUCTOR DEVICE

(71) Applicant: TAIWAN SEMICONDUCTOR MANUFACTURING CO., LTD., Hsinchu (TW)

(72) Inventors: Chung-Yen Chou, Hsinchu (TW); Po-Ken Lin, Hsinchu (TW); Chia-Shiung Tsai, Hsin-Chu (TW); Xiao-Meng Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 96 days.

(21) Appl. No.: 14/027,519

(22) Filed: Sep. 16, 2013

(65) Prior Publication Data

US 2015/0076657 A1 Mar. 19, 2015

(51) Int. Cl.  
*H01L 49/02* (2006.01)  
*H01L 27/08* (2006.01)  
*H01L 29/66* (2006.01)  
*H01L 29/94* (2006.01)

(52) U.S. Cl.  
CPC ............ *H01L 27/0805* (2013.01); *H01L 28/90* (2013.01); *H01L 29/66181* (2013.01); *H01L 29/945* (2013.01)

(58) Field of Classification Search  
CPC ....................................................... H01L 28/60  
USPC ............................................................ 257/532  
See application file for complete search history.

(56) References Cited

U.S. PATENT DOCUMENTS

| 6,538,287 B2 * | 3/2003 | Wang et al. ................. 257/350 |
| 8,557,657 B1 * | 10/2013 | Basker et al. ............... 438/247 |
| 2013/0161792 A1 * | 6/2013 | Tran et al. .................. 257/534 |

* cited by examiner

*Primary Examiner* — Matthew W Such  
*Assistant Examiner* — Warren H Kilpatrick  
(74) *Attorney, Agent, or Firm* — McDermott Will & Emery LLP

(57) ABSTRACT

A novel method for manufacturing a semiconductor device and a semiconductor device are provided. The semiconductor device includes a substrate, a trench capacitor, a contact pad, an inter-layer dielectric (ILD) layer and contact elements. The trench capacitor includes a doped region, a first dielectric layer, a bottom electrode, a second dielectric layer and a top electrode, in which the contact pad is positioned on the doped region. The ILD layer has contact windows, and the contact elements are disposed therein. Because of the presence of the contact pad positioned on the doped region, the thickness of the ILD layer over the top electrode is increased but still satisfying the requirement of the maximum depth limit to the contact windows of etching the ILD layer.

19 Claims, 9 Drawing Sheets

METHOD FOR MANUFACTURING SEMICONDUCTOR DEVICE AND SEMICONDUCTOR DEVICE

BACKGROUND

A memory cell of a dynamic random access memory (DRAM) is composed of a metal oxide semiconductor (MOS) transistor and a capacitor. The capacitor is generally designed as either a stack capacitor stacked on a substrate or a deep trench capacitor buried within a substrate.

A common deep trench capacitor is a small three-dimensional device formed by etching a trench into a semiconductor substrate of the device. After trench etching, a doped region may be formed in the lower portion around and below the trench, which serves as a buried plate electrode of a trench capacitor. A dielectric layer may be formed over the buried plate electrode in the trench. The dielectric layer serves as an insulating layer between the electrodes of the trench capacitor. The trench is filled, for example, with conductive polycrystalline silicon (poly-Si), which serves as an upper electrode of the trench capacitor.

In order to increase capacitance of the trench capacitor, a dual deep trench capacitor is provided. The dual deep trench capacitor has four layers composed of a lower conductive layer, an upper conductive layer, and two dielectric layers which are respectively disposed beneath the lower conductive layer and between the lower conductive layer and the upper conductive layer. After forming the four layers, an inter-layer dielectric (ILD) layer is formed covering the dual deep trench capacitor. However, topology variations from the formation of the four layers in the trench and on the top of the semiconductor substrate result in an uneven surface of the ILD layer. Therefore, semiconductor planarization techniques, such as chemical mechanical polishing (CMP), have been utilized in smoothing the topology variations of the ILD layer. Nevertheless, the ILD layer has a relatively low thickness that may be polished over during the polishing process and short the upper conductive layer and any electronic component disposed on the ILD layer. Accordingly, improvements in structures and methods of forming the dual trench capacitor continue to be sought.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, an inter-layer dielectric (ILD) layer includes embodiments having two or more such ILD layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Figure 1:
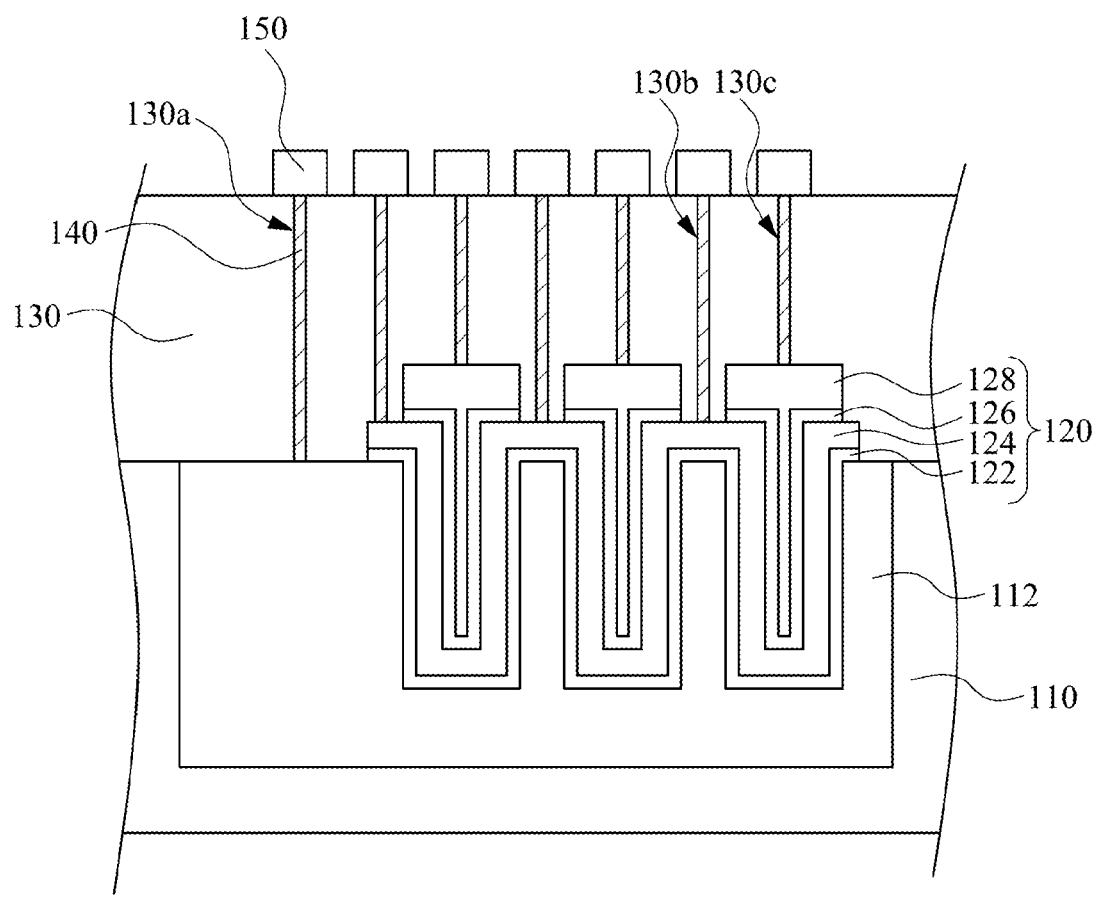
FIG. 1 is a cross-sectional view of a general semiconductor device.

FIG. 1 is a cross-sectional view of a general semiconductor device 10. The semiconductor device 10 includes a substrate 110, a dual deep trench capacitor 120, an inter-layer dielectric (ILD) layer 130, contact elements 140 and metal lines 150. The substrate 110 has a doped region 112, and the deep trench capacitor 120 is buried within the doped region 112. The deep trench capacitor 120 includes a first dielectric layer 122, a bottom electrode 124, a second dielectric layer 126 and a top electrode 128. The ILD layer 130 covers the deep trench capacitor 120 and has a plurality of contact windows 130a, 130b and 130c. The contact elements 140 are disposed in the contact windows 130a, 130b and 130c to respectively connect to the doped region 112, the bottom electrode 124 and the top electrode 128. The metal lines 150 are formed on the ILD layer 130 and respectively connected to the contact elements 140.

Generally, after the ILD layer 130 is formed, it is polished and then patterned to form the contact windows 130a, 130b and 130c by photolithographic and etching processes. The ILD layer 130 right above the top electrode 128 has a relatively low thickness, such that it may be polished over and a short may occur between the top electrode 128 and the metal lines 150. To address this issue, a total thickness of the ILD layer 130 may be increased so as to raise the thickness thereof over the top electrode 128. However, there is a maximum depth limit of etching the ILD layer 130 to form the contact windows 130a, 130b and 130c. If the total thickness of the ILD layer 130 increases, a depth of the contact window 130a may exceed the depth limit of etching the ILD layer to successfully form the contact window 130a.

Figure 2:
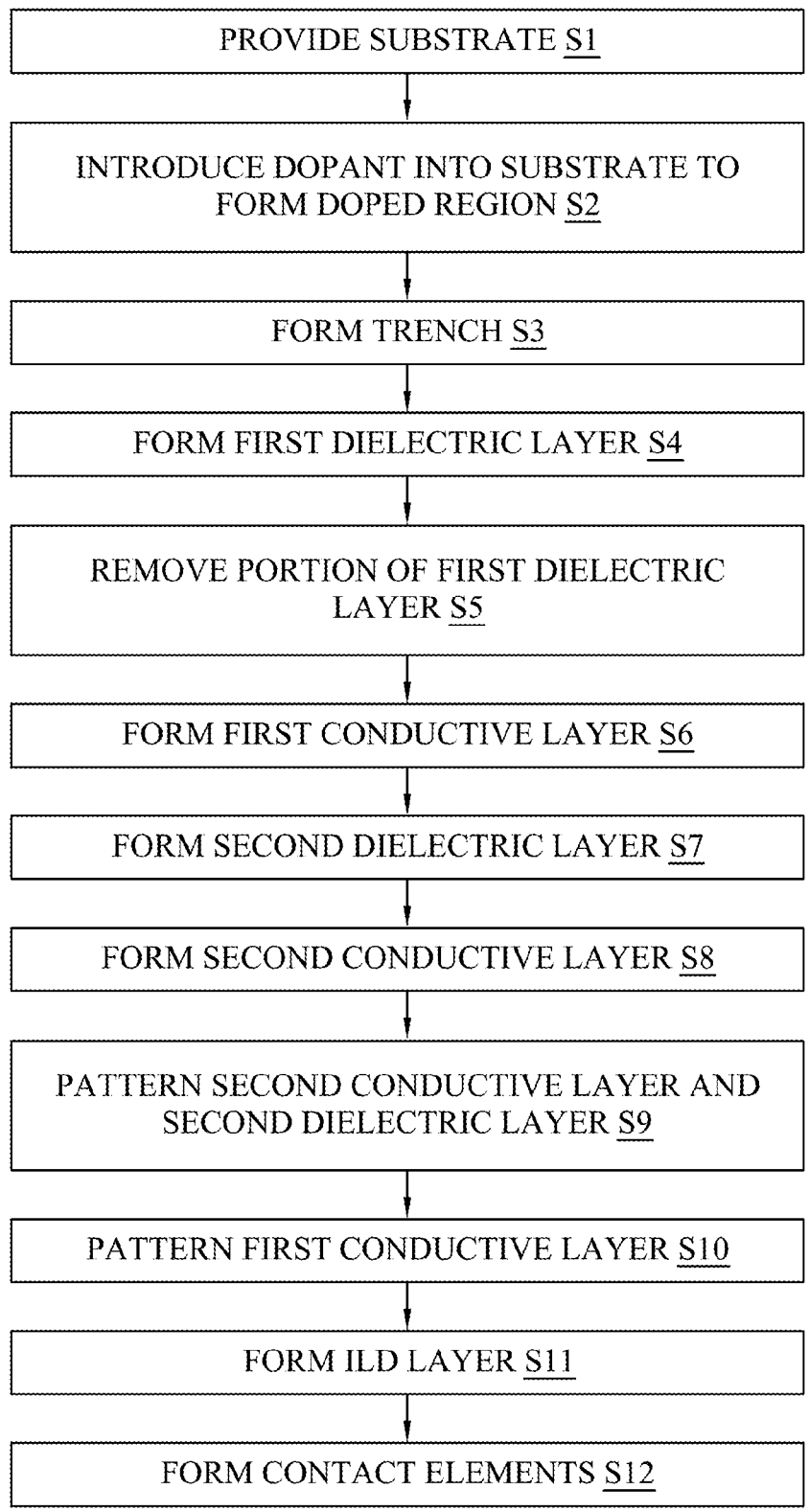
FIG. 2 is a flow chart illustrating a method of manufacturing a semiconductor device according to various embodiments of the present disclosure.

Referring to FIG. 2, a method of manufacturing a semiconductor device is illustrated according to various embodiments of the present disclosure. The operations of the method in FIG. 2 are explained in FIGS. 3A-3I are cross-sectional views at various stages of manufacturing a semiconductor device according to one embodiment of the present disclosure. It is understood that FIGS. 3A-3I have been simplified for a better understanding of the inventive concepts of the present disclosure.

Figure 3A:
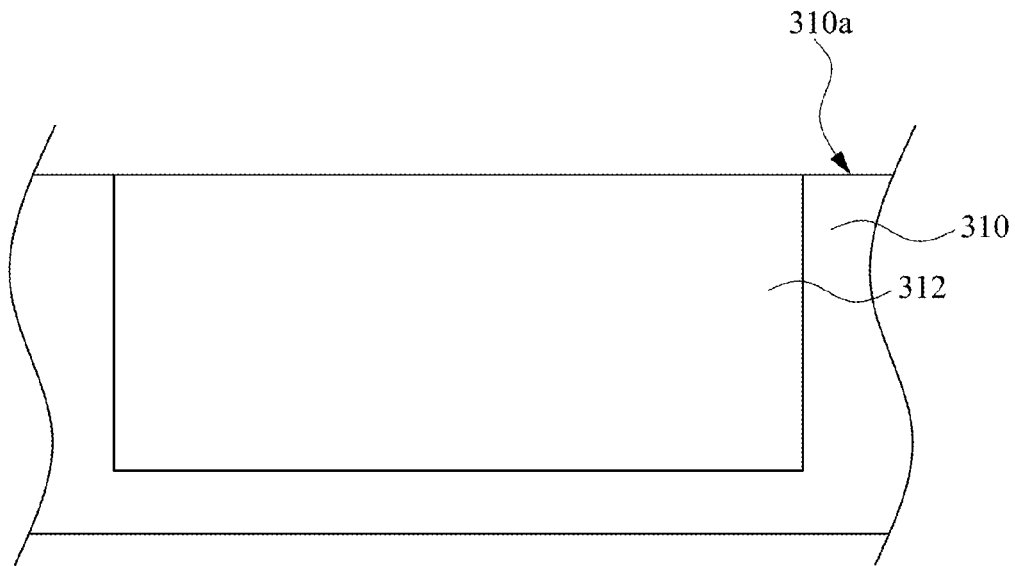
FIGS. 3A-3I are cross-sectional views at various stages of manufacturing a semiconductor device according to one embodiment of the present disclosure.

In operation S1, a substrate 310 having an upper surface 310a is provided, as shown in FIG. 3A. The substrate 310 may be a wafer made of semiconductor material such as silicon, germanium, silicon germanium, silicon carbide, and those consisting essentially of III-V compound semiconductors. The substrate 310 may be amorphous, polycrystalline, or single-crystalline.

Still referring to FIG. 3A, in operation S2, a dopant is introduced into the substrate 310 to form a doped region 312 beneath the upper surface 310a of the substrate 310. In one embodiment, the doped region 312 is an N-type doped region formed by implanting an N-type dopant into the substrate 310. For instance, phosphor is implanted in the substrate 310 to form the doped region 312. Alternatively, other N-type dopants such as arsenic and antimony may be used in the ion implantation process.

Figure 3B:
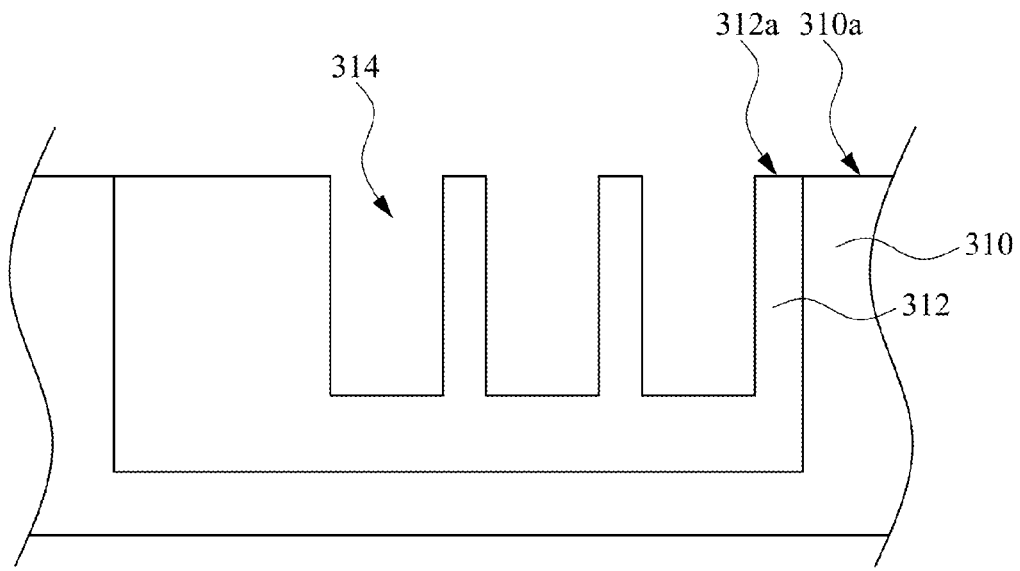

In operation S3, a trench 314 is formed extending into the doped region 312 from an upper surface 312a of the doped region 312, as shown in FIG. 3B. The trench 314 may be defined by reactive ion etching (RIE).

Figure 3C:
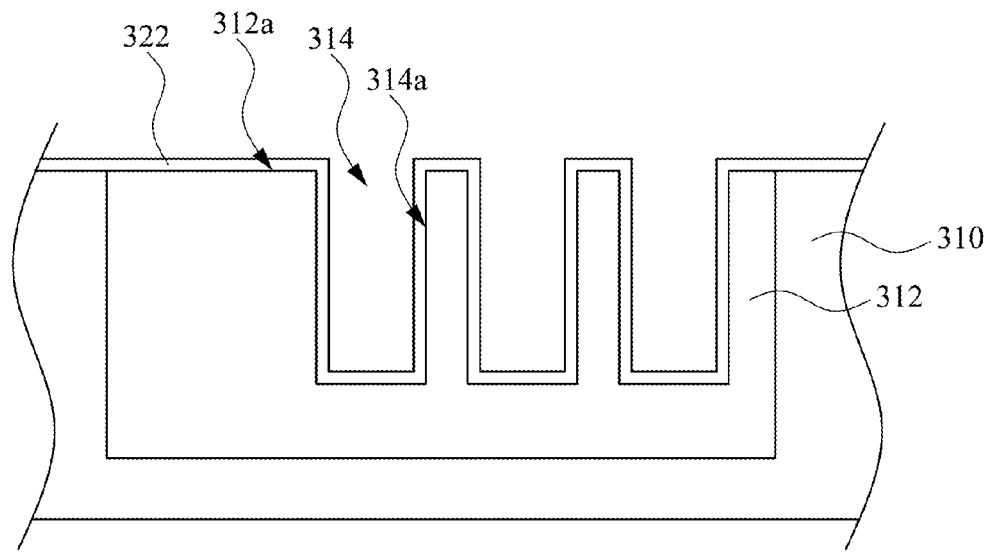

In operation S4, as shown in FIG. 3C, a first dielectric layer 322 is conformally formed on an inner surface 314a of the trench 314 and the upper surface 312a of the doped region 312. The first dielectric layer 322 may be made of thermally grown material including silicon oxide or silicon nitride. The first dielectric layer 322 may be deposited by chemical vapor deposition (CVD), such as plasma enhanced CVD (PECVD), low pressure CVD (LPCVD) or atmosphere pressure CVD (APCVD). In one embodiment, the first dielectric layer 322 has a thickness of about 20-400 angstroms. In one embodiment, the first dielectric layer 322 is an oxide/nitride/oxide (ONO) layer.

Figure 3D:
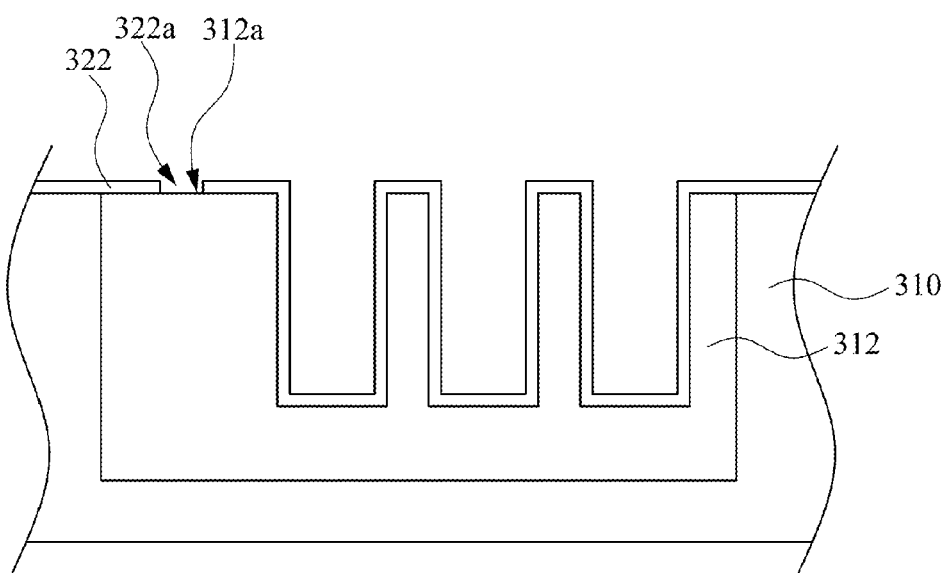

In operation S5, a portion of the first dielectric layer 322 is removed to form an opening 322a exposing a portion of the upper surface 312a of the doped region 312, as shown in FIG. 3D. For an example, a patterned mask layer (not shown) is formed on the first dielectric layer 322, and the portion of the first dielectric layer 322, which is not covered with the patterned mask layer, is then removed to form the opening 322a. In the operation S5, a dry etching process may be performed to remove the portion of the first dielectric layer 322.

Figure 3E:
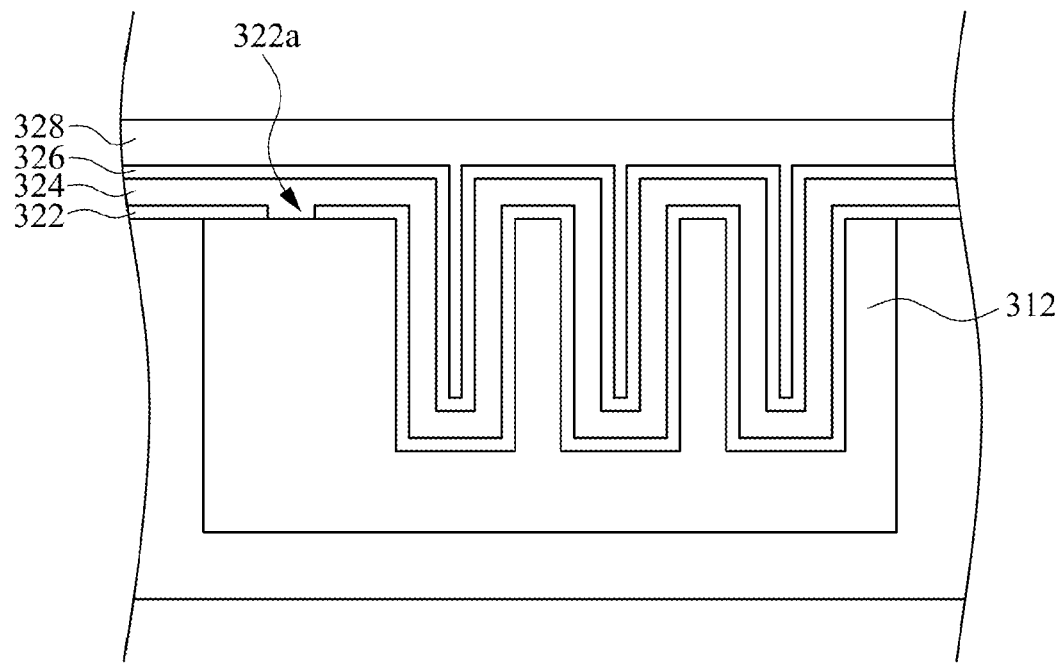

In operation S6, a first conductive layer 324 is conformally formed on the first dielectric layer 322 and in the opening 322a, as shown in FIG. 3E. The first conductive layer 324 may be made of polysilicon or other suitable material and fabricated by deposition, such as CVD or physical vapor deposition (PVD). In various embodiments, the first conductive layer 324 has a thickness of about 1,000-3,000 angstroms.

Still referring to FIG. 3E, in operation S7, a second dielectric layer 326 is conformally formed on the first conductive layer 324. The specific features of the second dielectric layer 326 may be referred to those exemplified for the first dielectric layer 322. In one embodiment, the second dielectric layer 326 has a thickness of about 20-400 angstroms. In one embodiment, the second dielectric layer 326 is an oxide/nitride/oxide (ONO) layer.

Still referring to FIG. 3E, in operation S8, a second conductive layer 328 is formed on the second dielectric layer 326. The specific features of the second conductive layer 328 may be referred to that exemplified for the first conductive layer 324. In various embodiments, the second conductive layer 328 has a thickness of about 4,000-6,000 angstroms.

Figure 3F:
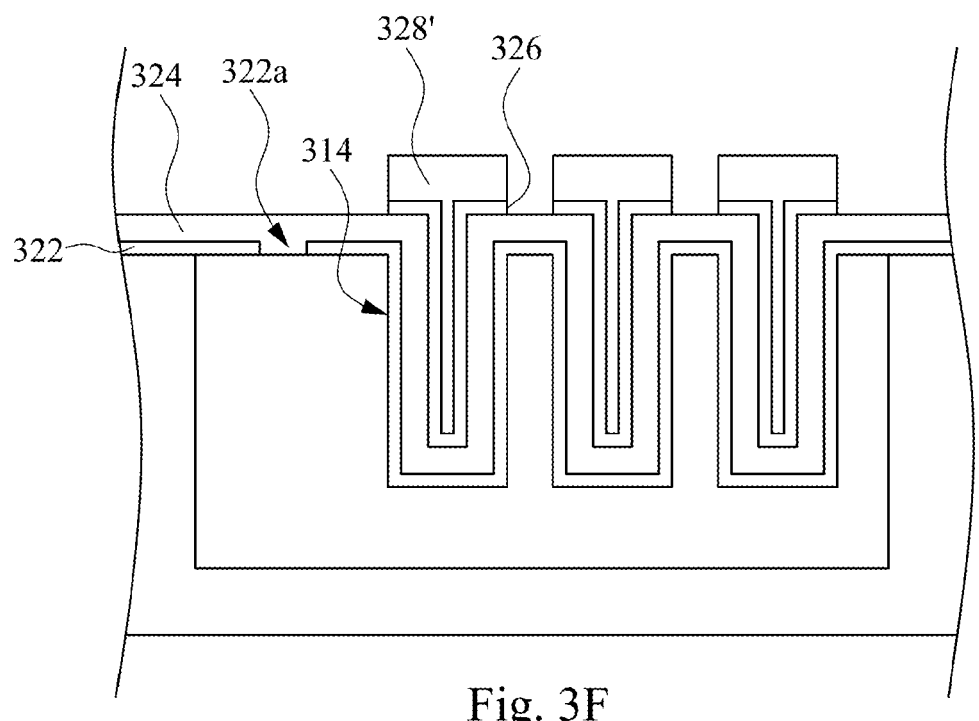

In operation S9, as shown in FIGS. 3E-3F, the second conductive layer 328 and the second dielectric layer 326 therebeneath are patterned to define a top electrode 328' over the trench 314 and expose a portion of the first conductive layer 324. As an example, a patterned mask layer (not shown) is formed on second conductive layer 328, and portions of the second conductive layer 328, which are not covered by the patterned mask layer, and the second dielectric layer 326 are then removed to define the top electrode 328'. A dry etching process may be performed to remove the portions of the second conductive layer 328 and the second dielectric layer 326.

Figure 3G:
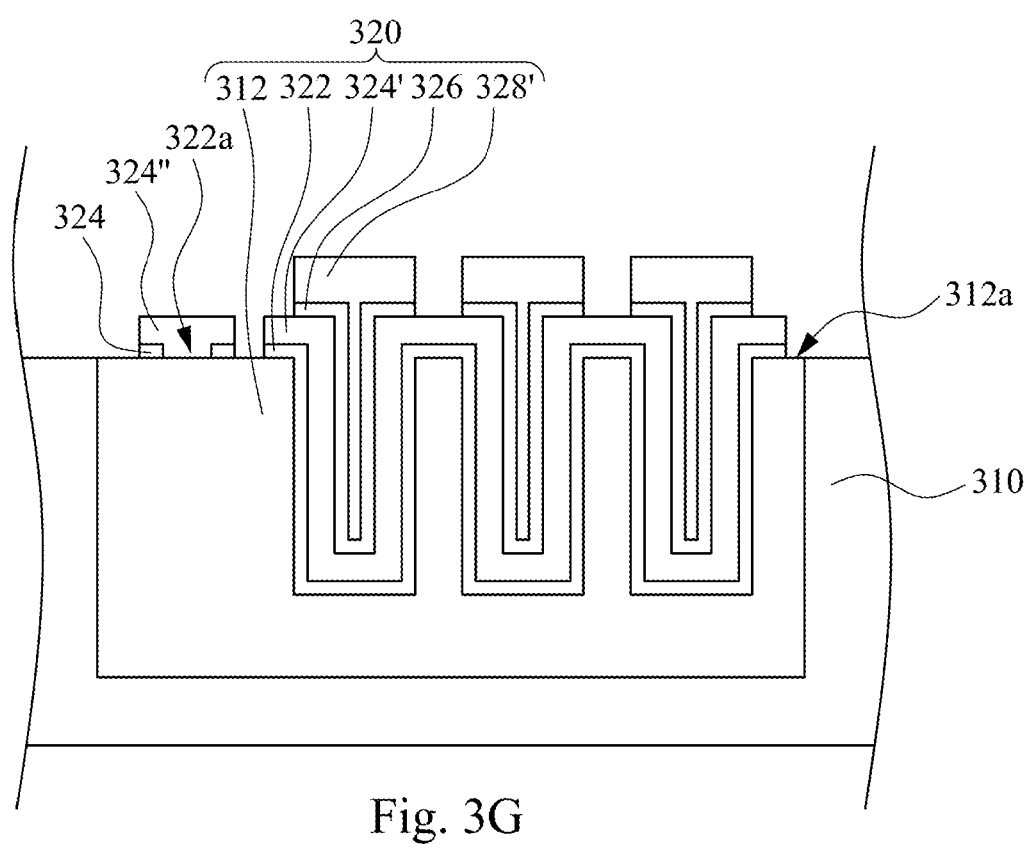

In operation S10, as shown in FIGS. 3F-3G, the portion of the first conductive layer 324 is patterned to define a bottom electrode 324' beneath the top electrode 328' and a contact pad 324" over the opening 322a. The bottom electrode 324' is isolated from the contact pad 324". The doped region 312, the first dielectric layer 322, the bottom electrode 324', the second dielectric layer 326 and the top electrode 328' constitute a trench capacitor 320. In the operation S10, the first dielectric layer 322 may be selectively patterned. In the illustrated embodiment, the operation S10 further includes patterning the first dielectric layer 322 beneath the portion of the first conductive layer 324. In another embodiment, the first dielectric layer 322 is not patterned (not shown).

Figure 3H:
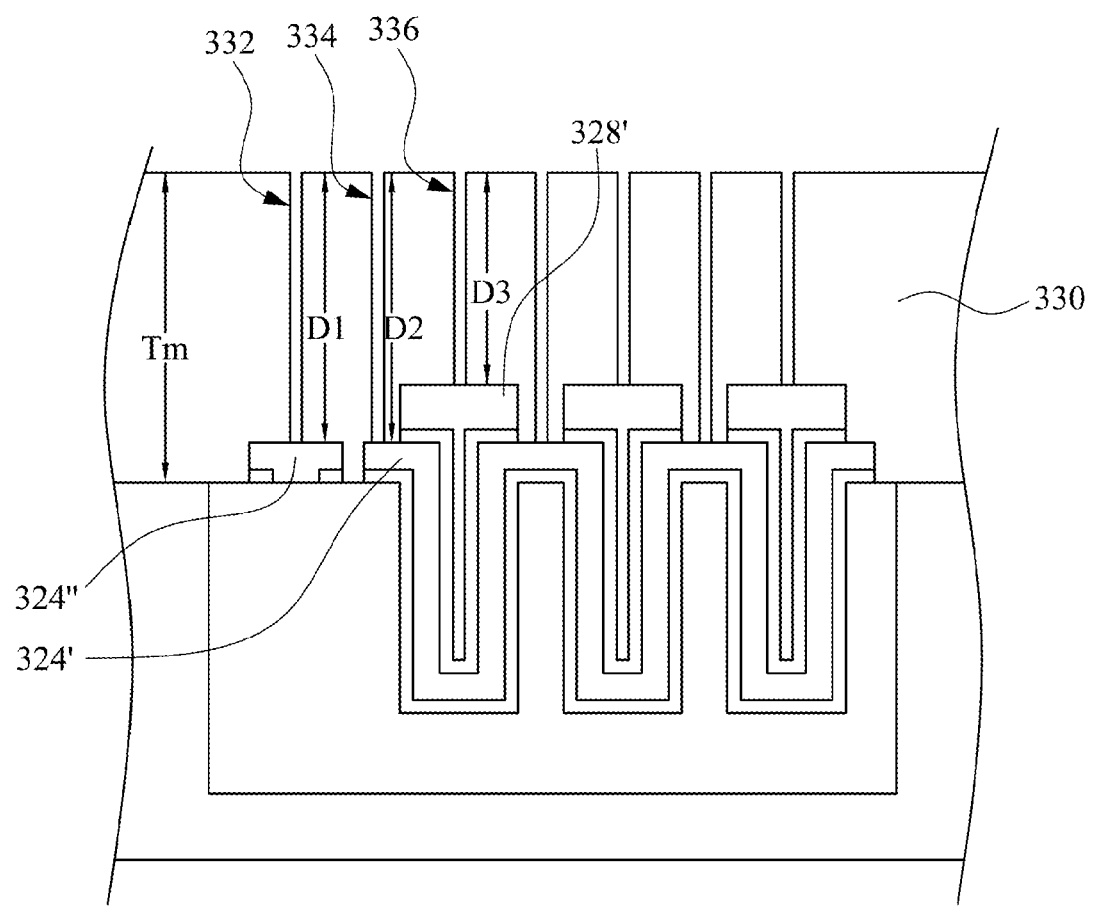

In operation S11, as shown in FIG. 3H, an inter-layer dielectric (ILD) layer 330 is formed covering the trench capacitor 320 shown in FIG. 3G and the contact pad 324". The ILD layer 330 may be formed by deposition, such as PECVD, LPCVD or APCVD.

In one embodiment, the method further includes polishing the ILD layer 330 after forming the ILD layer 330 covering the trench capacitor 320 and the contact pad 324" (i.e. the operation S11). In one embodiment, a chemical mechanical polishing (CMP) process is performed on the ILD layer 330 to form a flat upper surface thereof.

In one embodiment, as shown in FIG. 3H, the method further includes an operation of patterning the ILD layer 330 to form a plurality of contact windows 332, 334 and 336 respectively exposing a portion of the contact pad 324", a portion of the bottom electrode 324' and a portion of the top electrode 328' after forming the ILD layer 330 covering the trench capacitor 320 and the contact pad 324" (i.e. the operation S11). For example, a patterned mask layer (not shown) is formed on the ILD layer 330, and a dry etching process is then performed to form the contact windows 332, 334 and 336 with various depths D1, D2 and D3.

The depths D1, D2, D3 is limited to a depth of etching the ILD layer 330 in the dry etching process. Compared to the semiconductor device 10 of FIG. 1, because of the presence of the contact pad 324", the thickness of the ILD layer 330 over the top electrode 328' may also become thicker. In other words, when the depth D1 in FIG. 3H within the depth limit is equal to the depth of the contact window 130a in FIG. 1, the maximum thickness Tm in FIG. 3H is greater than the total thickness of the ILD layer 130 in FIG. 1. Specifically, the maximum thickness Tm in FIG. 3H is thicker than the total thickness of the ILD layer 130 in FIG. 1 in about a thickness of the contact pad 324". Accordingly, the ILD layer 330 over the top electrode 328' is also thicker than that shown in FIG. 1. As such, the ILD layer 330 has a sufficient thickness over the top electrode 328' to prevent it from being polished over during the polishing process.

Figure 3I:
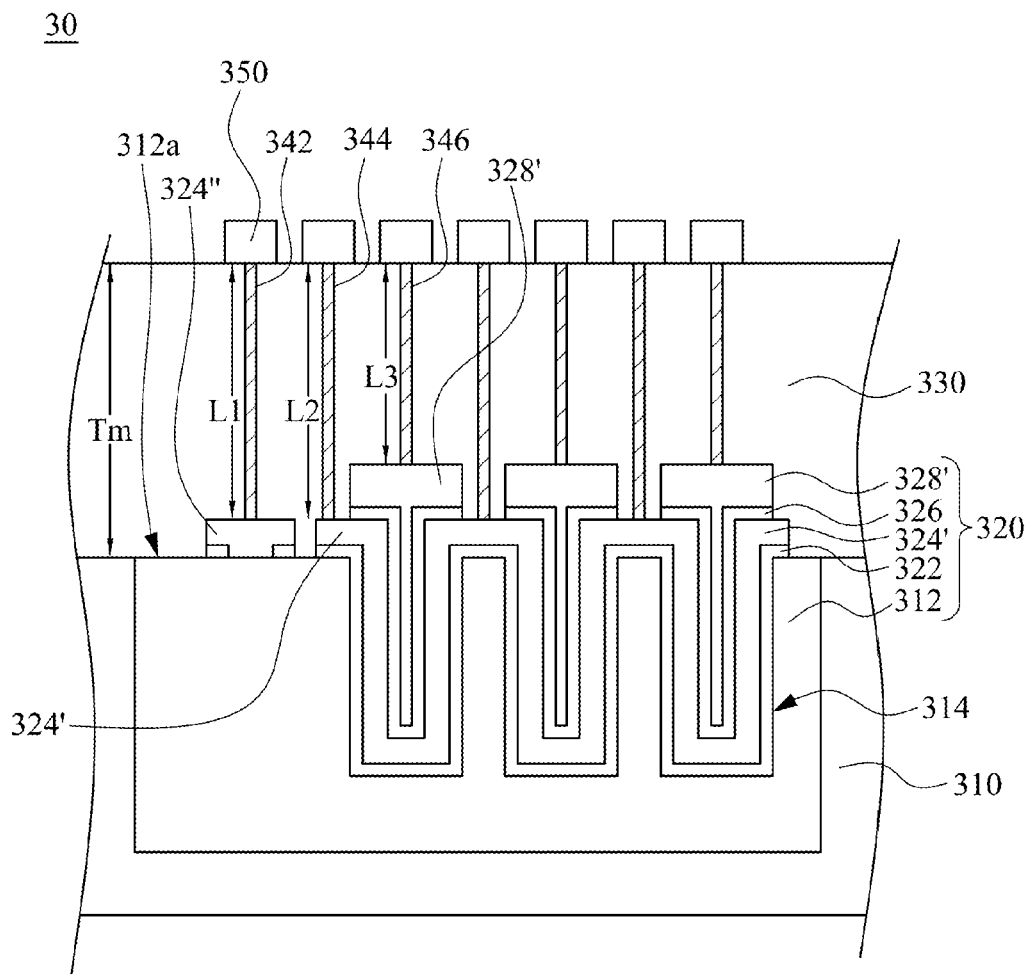

In a operation S12, a plurality of contact elements 342, 344 and 346 are formed in the ILD layer 330 to respectively contact the contact pad 324", the bottom electrode 324' and the top electrode 328', as shown in FIG. 3I. In one embodiment, the contact elements 342, 344 and 346 are made of tungsten and formed by deposition. The maximum thickness Tm of the ILD layer 330 is greater than a length L1, L2 or L3 of each of the contact elements 342, 344 and 346. Of course, the maximum thickness Tm of the ILD layer 330 is greater than a depth D1, D2 or D3 of each of the contact windows 332, 334 and 336, as shown in FIG. 3H. After performing the operation S12, a plurality of metal lines 350 may be formed on an upper surface of the ILD layer 330 to respectively contact the contact elements 342, 344 and 346.

FIG. 3I is a cross-sectional view of a semiconductor device 30 according to one embodiment of the present disclosure. The semiconductor device 30 includes a substrate 310, a trench capacitor 320, a contact pad 324", an ILD layer 330 and contact elements 342, 344 and 346.

The specific features of the substrate 310 may be referred to those exemplified for the substrate 310 above. The trench capacitor 320 is located in the substrate 310 and includes a doped region 312, a first dielectric layer 322, a bottom electrode 324', a second dielectric layer 326 and a top electrode 328'.

The doped region 312 extends into the substrate 310 from an upper surface of the substrate 310. The doped region 312 may be an N-type doped region or a P-type doped region. The doped region 312 has a trench 314 extending into the doped region 312 from an upper surface of the doped region 312. In one embodiment, the trench 314 has an aspect ratio in a range of about 10:1 to about 50:1. In the illustrated embodiment, the trench 314 does not extend through the entire doped region 312.

The first dielectric layer 322 is disposed on an inner surface of the trench 314. The bottom electrode 324' is disposed on the first dielectric layer 322. The second dielectric layer 326 is disposed on the bottom electrode 324'. The top electrode 328' is disposed on the second dielectric layer 326. The specific features of the first dielectric layer 322, the bottom electrode 324', the second dielectric layer 326 and the top electrode 328 may be referred to those exemplified for the first dielectric layer 322, the bottom electrode 324', the second dielectric layer 326 and the top electrode 328 above.

The contact pad 324" is disposed on and contacting a portion of the upper surface 312a of the doped region 312. The contact pad 324" and the bottom electrode 324' of the trench capacitor 320 are separated to each other. In one embodiment, the contact pad 324" and the bottom electrode 324' of the trench capacitor 320 are made of a same conductive material. In one embodiment, the contact pad 324" and the bottom electrode 324' of the trench capacitor 320 are made of a same conductive layer, such as a polysilicon layer. Thus, the contact pad 324" may have substantially a same height as the bottom electrode 324' after patterning the conductive layer. Specifically, the contact pad 324" and the bottom electrode 324' are formed by performing identical photolithographic and etching processes on the above-mentioned conductive layer.

The ILD layer 330 covers the trench capacitor 320 and the contact pad 324". In one embodiment, the ILD layer 330 on the top electrode 328' is greater than about 3 k angstroms. In one embodiment, the ILD layer 330 on the top electrode 328" is greater than about 3,000 angstroms and equal to or lower than about 5,000 angstroms. In the illustrative embodiment, the ILD layer 330 contacts another portion of the upper surface 312a of the doped region 312 between the contact pad 324" and the bottom electrode 324'.

The contact elements 342, 344 and 346 are located in the ILD layer 330 and respectively contacting the contact pad 324", the bottom electrode 324' and the top electrode 328'. In one embodiment, the contact elements 342, 344 and 346 are tungsten contact plugs. As shown in FIG. 3H, the ILD layer 330 has a plurality of contact windows 332, 334 and 336 with various depths D1, D2 and D3 to expose a portion of the contact pad 324", a portion of the bottom electrode 324' and a portion of the top electrode 328'. The contact elements 342, 344 and 346 are respectively disposed in the contact windows 332, 334 and 336. Because of the presence of the contact pad 324", a maximum thickness Tm of the ILD layer 330 in FIG. 3H is thicker than the total thickness of the ILD layer 130 in FIG. 1 of about a thickness of the contact pad 324". Also, the ILD layer 330 over the top electrode 328' is thicker than that shown in FIG. 1.

In the present embodiment, the maximum thickness Tm of the ILD layer 330 is greater than a length L1, L2 or L3 of each of the contact elements 342, 344 and 346. As a result, the maximum thickness Tm of the ILD layer 330 is greater than a depth D1, D2 or D3 of each of the contact windows 332, 334 and 336. In one embodiment, the ILD layer 330 has a maximum thickness Tm equal to or greater than about 10,000 angstroms, and each of the contact elements 342, 344 and 346 has a length L1, L2 or L3 lower than about 10,000 angstroms.

In some embodiments, the contact elements 342, 344 and 346 are physically in direct contact with the doped region 312, in that the contact element 342 is already electrically connected to the doped region 312 through the contact pad 324" and thus needs no other conductive element therebetween.

In one embodiment, the semiconductor device 30 further includes a plurality of metal lines 350 on the ILD layer 330 and respectively contacting the contact elements 342, 344 and 346. The contact elements 342, 344 and 346 are acted as electrical connections between the metal lines 350 and the contact pad 324", the bottom electrode 324' and the top electrode 328' respectively.

Figure 4:
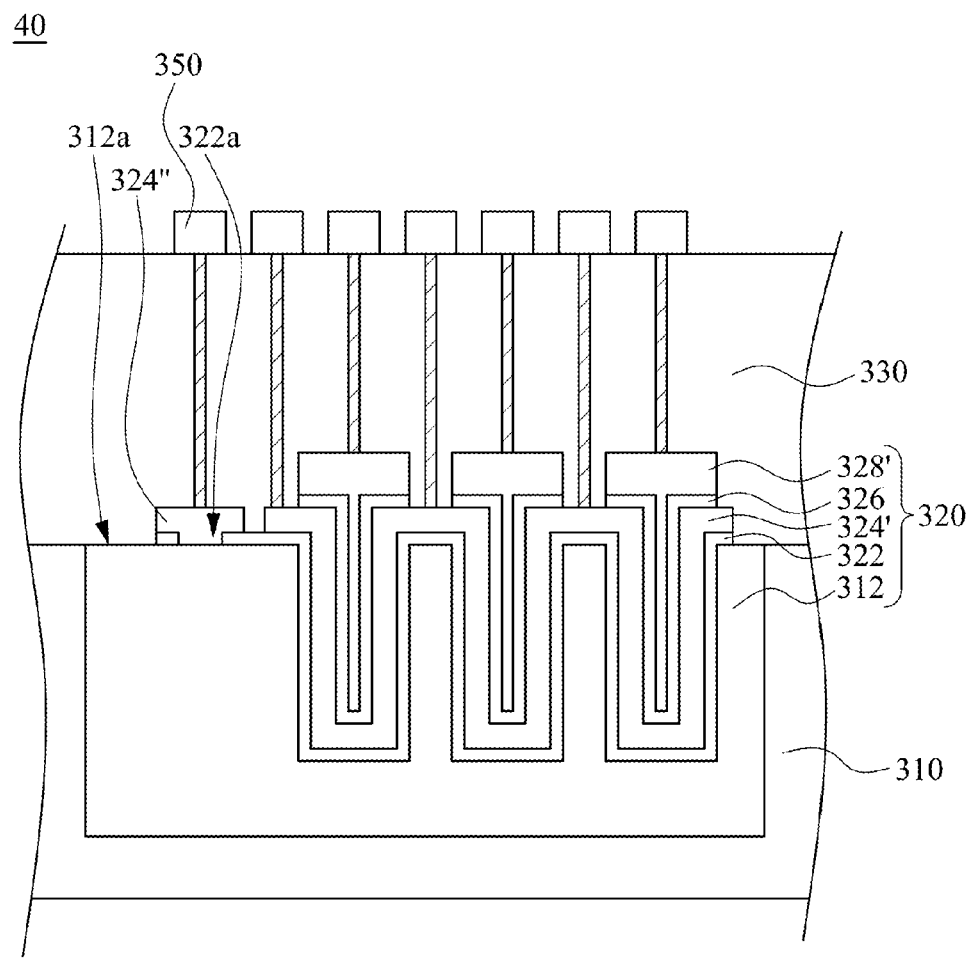
FIG. 4 is a cross-sectional view of a semiconductor device according to another embodiment of the present disclosure.

FIG. 4 is a cross-sectional view of a semiconductor device 40 according to another embodiment of the present disclosure. The difference between the embodiments shown in FIGS. 3I and 4 is that the first dielectric layer 322 extends over the upper surface 312a of the doped region 312 and has an opening 322a exposing the portion of the upper surface 312a of the doped region 312, and the contact pad 324" is disposed over the opening 322a.

The embodiments of the present disclosure discussed above have advantages over existing structures and methods. Because of the presence of the contact pad positioned on the doped region, the thickness of the ILD layer over the top electrode is increased but still satisfying the requirement of the maximum depth limit to the contact windows of etching the ILD layer. It is understood, however, that other embodiments may have different advantages, and that no particular advantage is required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for manufacturing a semiconductor device, the method comprising:

introducing a dopant into a substrate to form a doped region;

forming a trench extending into the doped region from an upper surface of the doped region;

forming a first dielectric layer on an inner surface of the trench and the upper surface of the doped region;

removing a portion of the first dielectric layer to form an opening exposing a portion of the upper surface of the doped region;

forming a first conductive layer on the first dielectric layer and in the opening;

forming a second dielectric layer on the first conductive layer;

forming a second conductive layer on the second dielectric layer;

patterning the second conductive layer and the second dielectric layer therebeneath to define a top electrode and expose an upper surface of a portion of the first conductive layer;

patterning the portion of the first conductive layer to form a bottom electrode beneath the top electrode and a contact pad over the opening, the contact pad and the bottom electrode made of a same conductive material, wherein the doped region, the first dielectric layer, the bottom electrode, the second dielectric layer and the top electrode constitute a trench capacitor;

forming an inter-layer dielectric (ILD) layer covering the trench capacitor and the contact pad; and forming a plurality of contact elements in the ILD layer to respectively contact an upper surface of the contact pad, the bottom electrode and the top electrode.

2. The method for manufacturing the semiconductor device of claim 1, further comprising polishing the ILD layer after forming the ILD layer covering the trench capacitor and the contact pad.

3. The method for manufacturing the semiconductor device of claim 1, further comprising patterning the ILD layer to form a plurality of contact windows respectively exposing a portion of the contact pad, a portion of the bottom electrode and a portion of the top electrode after forming the ILD layer covering the trench capacitor and the contact pad.

4. The method for manufacturing the semiconductor device of claim 3, wherein the ILD layer has a maximum thickness greater than a depth of each of the contact windows.

5. The method for manufacturing the semiconductor device of claim 1, wherein the ILD layer has a maximum thickness greater than a length of each of the contact elements.

6. The method for manufacturing the semiconductor device of claim 1, wherein patterning the portion of the first conductive layer further comprises patterning the first dielectric layer beneath the portion of the first conductive layer.

7. A semiconductor device, comprising:
a substrate;
a trench capacitor in the substrate, wherein the trench capacitor comprises:
a doped region in the substrate, wherein the doped region has a trench extending into the doped region from an upper surface of the doped region;
a first dielectric layer on an inner surface of the trench;
a bottom electrode on the first dielectric layer;
a second dielectric layer on the bottom electrode; and
a top electrode on the second dielectric layer;
a contact pad on and contacting a portion of the upper surface of the doped region, wherein the contact pad and the bottom electrode of the trench capacitor are made of a same conductive material;
an ILD layer covering the trench capacitor and the contact pad; and
a plurality of contact elements in the ILD layer and respectively contacting the contact pad, the bottom electrode and the top electrode.

8. The contact structure of the semiconductor device of claim 7, wherein the contact pad and the bottom electrode of the trench capacitor are made of a same conductive layer.

9. The contact structure of the semiconductor device of claim 7, wherein the contact pad has substantially a same height as the bottom electrode.

10. The contact structure of the semiconductor device of claim 7, wherein the ILD layer has a plurality of contact windows to expose a portion of the contact pad, a portion of the bottom electrode and a portion of the top electrode, and the contact elements are respectively disposed in the contact windows.

11. The contact structure of the semiconductor device of claim 10, wherein the ILD layer has a maximum thickness greater than a depth of each of the contact windows.

12. The contact structure of the semiconductor device of claim 7, wherein the ILD layer has a maximum thickness greater than a length of each of the contact elements.

13. The contact structure of the semiconductor device of claim 7, wherein the contact elements are physically in direct contact with the doped region.

14. The contact structure of the semiconductor device of claim 7, wherein the first dielectric layer extends over the upper surface of the doped region and has an opening exposing the portion of the upper surface of the doped region, and the contact pad is disposed over the opening.

15. The contact structure of the semiconductor device of claim 7, wherein the ILD layer on the top electrode is greater than about 3,000 angstroms.

16. The contact structure of the semiconductor device of claim 7, wherein the ILD layer on the top electrode is greater than about 3,000 angstroms and equal to or lower than about 5 k angstroms.

17. The contact structure of the semiconductor device of claim 7, wherein the ILD layer has a maximum thickness equal to or greater than about 10,000 angstroms, and each of the contact elements has a length lower than about 10,000 angstroms.

18. The contact structure of the semiconductor device of claim 7, wherein the doped region extends into the substrate from an upper surface of the substrate.

19. A semiconductor device, comprising:
a substrate;
a trench capacitor in the substrate, wherein the trench capacitor comprises:
a doped region in the substrate, wherein the doped region has a trench extending into the doped region from an upper surface of the doped region;
a first dielectric layer on an inner surface of the trench;
a bottom electrode on the first dielectric layer;
a second dielectric layer on the bottom electrode; and
a top electrode on the second dielectric layer;
a contact pad on and contacting a portion of the upper surface of the doped region, wherein the contact pad has substantially a same height as the bottom electrode;
an ILD layer covering the trench capacitor and the contact pad; and
a plurality of contact elements in the ILD layer and respectively contacting the contact pad, the bottom electrode and the top electrode.

* * * * *